(12) United States Patent
Mayer

(10) Patent No.: US 6,253,675 B1
(45) Date of Patent: Jul. 3, 2001

(54) SOLDER PASTE STENCILING APPARATUS AND METHOD OF USE FOR REWORK

(76) Inventor: Carl P. Mayer, 43 Pleasant St., Sharon, MA (US) 02067

( * ) Notice: Subject to any disclaimer, the term of this patent is extended or adjusted under 35 U.S.C. 154(b) by 0 days.

(21) Appl. No.: 09/342,839

(22) Filed: Jun. 29, 1999

(51) Int. Cl.[7] .................................................. B05C 17/06
(52) U.S. Cl. ................................. 101/127.1; 101/128.21; 101/129
(58) Field of Search .................................. 101/114, 127, 101/127.1, 128.21, 128.4, 126, 129

(56) References Cited

U.S. PATENT DOCUMENTS

| | | | |
|---|---|---|---|
| 4,310,811 | 1/1982 | Currie | 333/1 |
| 4,351,238 | * 9/1982 | Harpold | 101/128.4 |
| 4,438,561 | 3/1984 | Mueller | 29/831 |
| 4,928,387 | * 5/1990 | Mather et al. | 29/840 |
| 5,107,759 | 4/1992 | Omori et al. | 101/114 |
| 5,392,980 | 2/1995 | Swamy et al. | 228/119 |
| 5,395,040 | 3/1995 | Holzmann | 228/254 |
| 5,400,220 | 3/1995 | Swamy | 361/760 |
| 5,407,724 | * 4/1995 | Mimura et al. | 428/141 |
| 5,511,306 | 4/1996 | Denton et al. | 29/840 |
| 5,514,462 | * 5/1996 | Endo et al. | 428/323 |
| 5,519,580 | 5/1996 | Natarajan et al. | 361/760 |
| 5,542,601 | 8/1996 | Fallon et al. | 228/119 |
| 5,553,538 | 9/1996 | Freitag | 101/123 |

(List continued on next page.)

FOREIGN PATENT DOCUMENTS

| | | |
|---|---|---|
| 0 818 811 A1 | 1/1998 | (EP) . |
| 04173385 | 6/1992 | (JP) . |
| 04346493 | 12/1992 | (JP) . |
| 08252988 | 10/1996 | (JP) . |
| WO 90/04912 | 5/1990 | (WO) . |
| WO 99/14049 | 3/1999 | (WO) . |

OTHER PUBLICATIONS

"Surface Mount Micro–Screener," IBM Technical Disclosure Bulletin, 37 (11) :271–274 (Nov. 1994).
Chai, Y. S., "Solder Paste Printing for BGA Rework," *Circuits Assembly*, pp. 30–31 (Oct. 1997).
Hwang, J.S., "BGA Rework Considerations," *SMT*, pp. 18–19 (Nov. 1998).
Gislao, M.J., "Reworking CSPs," *SMT*, pp. 63–64 (May 1998).
Goulker, B. R., "Selecting a Metal Stencil," *Electronic Packaging & Production*, pp. 35, 36, 38, 40, 41 (Oct. 1998).
Zamborsky, E., "Fundamentals of BGA Rework," *SMT*, pp. 76, 78, 79 (Feb. 1999).
Russell, E., "Preparing the Site," *PCB Assembly*, pp. 20–22, 24 (Feb. 1999).
Miller, G. and Zweig, S., "BGA Rework and X–Ray Inspection," *SMT*, pp. 62–64 (Apr. 1999).

*Primary Examiner*—Ren Yan
(74) *Attorney, Agent, or Firm*—Hamilton, Brook, Smith & Reynolds, P.C.

(57) ABSTRACT

A solder paste stencil printing apparatus and method for applying a controlled pattern and volume of solder paste onto a single area array component site on a populated printed circuit board (PCB). The stencil is a disposable, adhesive-backed, flexible, polymer membrane. The stencil has a plurality of holes in a pattern corresponding to a component site pad pattern on a printed circuit board. A periphery area of the stencil can be folded or shaped to fit into the available space to be stenciled. The method of applying the solder paste to the PCB includes shaping the stencil to fit available space, removing protective adhesive backer layer, aligning stencil with mating pad pattern on the PCB, and adhering stencil to PCB surface. The secure stencil insures efficient, accurate alignment and secure gasketing of stencil apertures to PCB pad pattern. Solder paste is then dispensed onto stencil surface, squeegeed across stencil surface until all apertures are filled level with top surface. Removable adhesive-backed stencil is then peeled away from the PCB surface to reveal finished solder paste pattern. The used stencil is disposed.

21 Claims, 8 Drawing Sheets

U.S. PATENT DOCUMENTS

| | | | |
|---|---|---|---|
| 5,563,380 | 10/1996 | Rostoker et al. | 174/260 |
| 5,601,675 | 2/1997 | Hoffmeyer et al. | 156/94 |
| 5,611,140 | 3/1997 | Kulesza et al. | 29/832 |
| 5,615,387 | 3/1997 | Crockett, Jr. et al. | 395/800 |
| 5,669,970 | 9/1997 | Balog et al. | 118/213 |
| 5,685,477 | 11/1997 | Mallik et al. | 228/254 |
| 5,695,109 | 12/1997 | Chiang et al. | 228/33 |
| 5,704,287 | 1/1998 | Omori et al. | 101/127.1 |
| 5,740,730 | 4/1998 | Thompson, Sr. | 101/127 |
| 5,755,157 | 5/1998 | Omori et al. | 101/114 |
| 5,761,803 | 6/1998 | St. John et al. | 29/852 |
| 5,766,031 | 6/1998 | Pickles et al. | 439/70 |
| 5,768,774 | 6/1998 | Wilson et al. | 29/840 |
| 5,769,989 | 6/1998 | Hoffmeyer et al. | 156/94 |
| 5,796,590 | 8/1998 | Klein | 361/774 |
| 5,806,178 | 9/1998 | Bell | 29/840 |
| 5,809,641 | 9/1998 | Crudo et al. | 29/840 |
| 5,843,808 | 12/1998 | Karnezos | 438/121 |
| 5,872,051 | 2/1999 | Fallon et al. | 438/616 |
| 5,873,512 | 2/1999 | Bielick et al. | 228/216 |

* cited by examiner

SOLDER PASTE STENCILING APPARATUS AND METHOD OF USE FOR REWORK

BACKGROUND OF THE INVENTION

The present invention relates generally to the assembly of semiconductor device packages onto printed circuit boards (PCB). More particularly, this invention relates to an improved stenciling apparatus and method for the deposition of solder paste material onto PCBs for the repair and rework of individual area array semiconductor device packages, also known as the ball grid array (BGA) and chip-scale package (CSP).

Circuit boards were initially developed using a plurality of holes for receiving leads from devices such as resistors, capacitors and transistors. The devices' leads were placed through the holes and soldered to the circuit board. The solder connected the lead to a conductive path on the circuit board. If a device did not work or was not properly connected to the circuit board, a user would use a soldering iron to heat the solder so that the solder could be removed by suction or other methods and the device removed. A new device then is placed on the board with the leads extending through the holes and then soldered in place.

As semiconductor devices/integrated circuits technology improved such that a greater number of elements and details could be placed in a smaller area, new technologies were developed such as surface mount technology (SMT) to allow for smaller and denser contacts or leads of semiconductor devices to be soldered directly to the surface of the printed circuit board (PCB). Area array packages, such as ball grid array (BGA) and chip-scale package (CSP), are becoming popular forms of high-density semiconductor packaging. Instead of leads extending their edges, these packages have an area array pattern of contact points or balls on the bottom side of the package that are not physically accessible after the device has been initially soldered to the PCB.

SMT utilizes a stencil printing method for applying solder paste to component pad patterns on the flat, planar surface of the unassembled PCB which already has the conductive paths on the board, using a metal stencil with apertures or openings corresponding to the component pad patterns on the PCB. The solder paste is a highly viscous material composed of fine solder particles blended with flux and other materials to render it printable. In this initial assembly process, sophisticated stencil printing machines align the frame-mounted stencil to the related PCB, bring the two into intimate contact, followed by a precision squeegee mechanism driving the solder paste material through the apertures onto the surface of the component mounting pads on the PCB in one pass. All component connection locations on the entire surface of the PCB are stenciled in one automated operation. The electronic components are subsequently placed onto the PCB with their contact points mating with PCB pad patterns onto which the solder paste has been precisely stenciled. The PCB with components thereon, then passes through an oven where the solder is melted or reflowed, thereby fusing the component contact points with the mating PCB pads.

Conventionally, individual semiconductor devices frequently require rework for the purpose of exchange, repair, or upgrading. As indicated above, BGA and CSP have their contact points on the bottom and are not accessible when mounted to the PCB. Rework of area array packages therefore requires removal of the device, and application of new solder paste to the PCB prior to reattachment of a replacement device. Due to the fact that the PCB is now populated with other components in close proximity, rendering the PCB a non-planar surface, the original primary stencil can no longer be used. This requires that new solder be re-applied to the component site by some other method.

One method to re-apply solder paste has been to utilize a syringe to dispense solder at each contact pad. However, this approach is slow and inconsistent in the amount of solder that is dispensed on each contact pad of a component footprint on the PCB (which can number hundreds of pads per component).

One of the more common techniques for re-application of solder paste to a single component site is to miniaturize existing primary SMT metal stencil technology. The mini metal stencil is a section of a primary stencil and uses the same technology. A flat mini metal stencil is custom sized to fit into the reworked space within the confines of surrounding components. The mini metal stencil may be formed with sides and features that allow for manual mechanical fixturing for alignment to the PCB pattern. However these mini metal stencils lack the mechanical support of the rigid stencil frame, as well as the automated functions of alignment, contact pressure, squeegeeing, and stencil lift-off that make the use of metal stencils successful in the primary SMT printing function.

The flat mini metal stencil is positioned by manual alignment and taping of the stencil's edges to the PCB. The formed mini metal stencil can be aligned with a mechanical arm, which requires set-up for each component location. Both of these methods can result in insufficient mechanical retention between stencil and PCB surface. Shifting of stencil position can occur during squeegee excursion or stencil removal requiring cleaning and re-stenciling. Alignment and positioning are difficult. Mini metal stencils must be cleaned thoroughly between each use.

Some of the difficulties with the mini metal stencil method include the possibility of not having enough solder paste deposited to form the contact pad or of having solder paste bleed under the stencil. In addition, the stencil might shift during squeegeeing passes. In that the stencil is made of metal, the stencil cannot be tailored with ease to fit the reworked site which is typically a confined space between other semiconductor devices. The result of these difficulties is the user of the mini metal stencils must acquire a high level of skill to successfully have the proper amount of solder paste deposited with only a single pass of the squeegee.

SUMMARY OF THE INVENTION

The invention relates to a solder paste stencil printing apparatus and method for applying a controlled pattern and volume of solder paste onto a single area array component site on a populated printed circuit board (PCB). The stencil is a disposable, adhesive-backed, flexible, membrane with a plurality of holes or apertures therethrough, in a pattern corresponding to the component site pad pattern, and including a periphery area that can be folded or shaped to fit into the available space to be stenciled. In a preferred embodiment, the stencil membrane is formed of a polymer.

In a preferred method of applying a solder paste pattern to the printed circuit board, the adhesive-backed stencil is shaped to fit available space, the protective adhesive backed layer is removed. The stencil is then aligned with the mating pad pattern on the PCB, and stencil is adhered to the PCB surface to thereby insure efficient, accurate alignment and secure gasketing of stencil apertures to PCB pad pattern. Solder paste is then dispensed onto the stencil surface and squeegeed across the stencil surface any number of times until all apertures are filled level with the top surface. The removable-adhesive-backed stencil is then peeled from the substrate surface to reveal the finished solder paste pattern. The used stencil is disposed.

An advantage of the present invention is that the polymer stencil is a flexible material and the outer tab (i.e., outline geometry) can be folded and fit into available space. Flexible fold-up stencil edges prevent spillage by damming the solder paste within the boundaries of the stencil. The stencil can be contoured by the operator to fit around obstacles and into confined areas, and can be adapted (trimmed, folded, etc) as circuit board layouts change.

Another advantage of the present invention is its residue-free, low adhesion, pressure-sensitive adhesive backing to achieve optimal seal/gasketing between stencil and PCB, resulting in a sharp high-quality printed image. The stencil allows for multiple squeegee passes if necessary to assure complete filling of apertures, without leakage, by means of an adhesive seal. This feature greatly reduces dependence on operator dexterity and skill.

Another advantage of the present invention is that it may be positioned manually or by mechanical fixturing and adhered with its own pressure-sensitive adhesive backing. This greatly reduces the risk of the stencil shifting position during printing. The ease of alignment and positioning is increased in one preferred embodiment due to the transparent nature of one preferred embodiment of the stencil.

Another advantage of the present invention is the low adhesion adhesive system that provides a smooth progressive peeling action during stencil removal, assuring an undisturbed printed solder paste pattern.

Another advantage of the present invention is that the low cost polymer membrane base material can be easily fabricated with specified aperture and outline features, using low cost standard fabrication methods.

Another advantage of the present invention is that it provides the option of tooling holes that can be used with stencil fixturing for alignment to the PCB.

Another advantage of the present invention is that it can be supplied as multiple units on a sheet or in roll format, allowing the user to simply peel off for use.

Another advantage of the present invention is its low cost and disposability, which reduces operator exposure to solder paste chemistries associated with stencil cleaning requirements of prior art.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
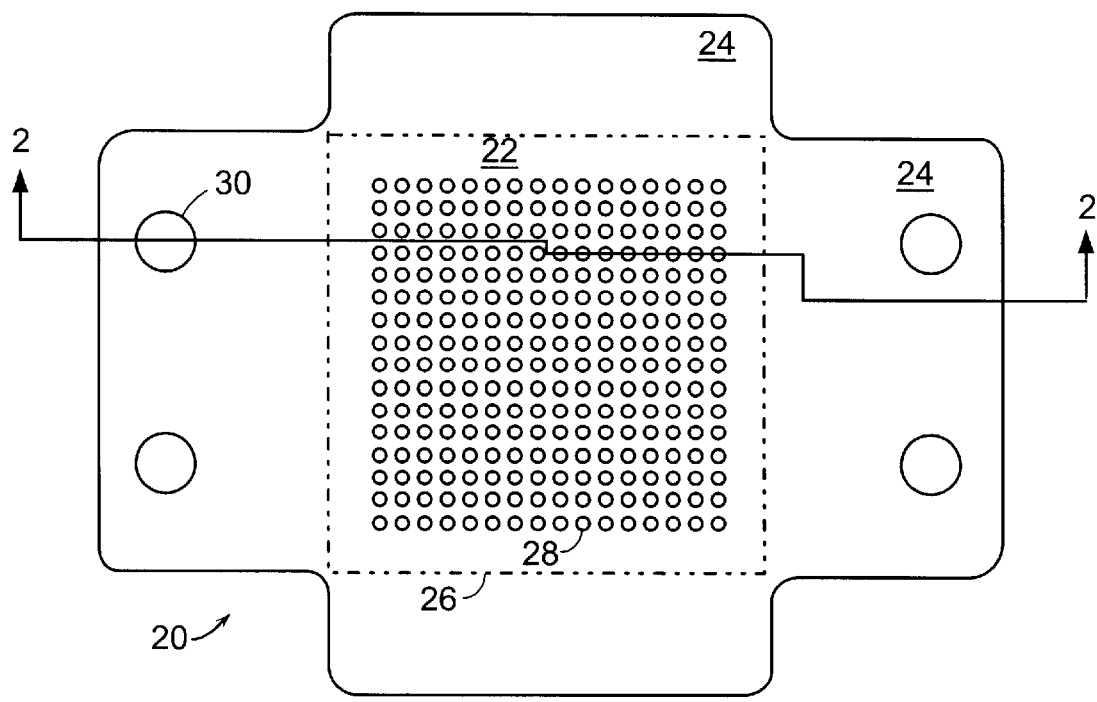
FIG. 1 is a top view of a stencil according to the invention.

Referring to the drawings in detail, where like numerals indicate like elements, there is illustrated a stencil apparatus in accordance with the present invention, generally referred to as 20 in FIG. 1.

Referring to FIG. 1, the stencil apparatus 20 is generally planar and has a central region 22 and a plurality of outer tabs 24. The central region 22 is demarked from the outer tabs 24 by a plurality of score lines 26. The score lines 26 are formed by scribing or pre-creasing during stencil 20 manufacturing. The central region 22 of the stencil apparatus 20 has a plurality of apertures 28 set in a specific pattern as described below. In a preferred embodiment, the stencil apparatus 20 has tooling holes 30 for receiving fixturing.

Figure 2:
FIG. 2 is a sectional view of the stencil taken along the line 2—2 of FIG. 1.

Referring to FIG. 2, a sectional view of the stencil apparatus 20 is shown. The apertures 28 ascend from a top surface 32 of the central region 22, as seen in FIG. 1, to a bottom surface 34. In addition, the apertures extend through an adhesive layer 38, as best seen in FIG. 4B, and a disposable backing 36 which is carried by the bottom surface 34 of the stencil apparatus. One of the tooling holes 30 is shown extending through an outer tab 24 of the stencil apparatus 20. In a preferred embodiment, the stencil has a thickness of generally between 0.075 mm (0.003 inches) and 0.152 mm (0.006 inches).

Figure 3:
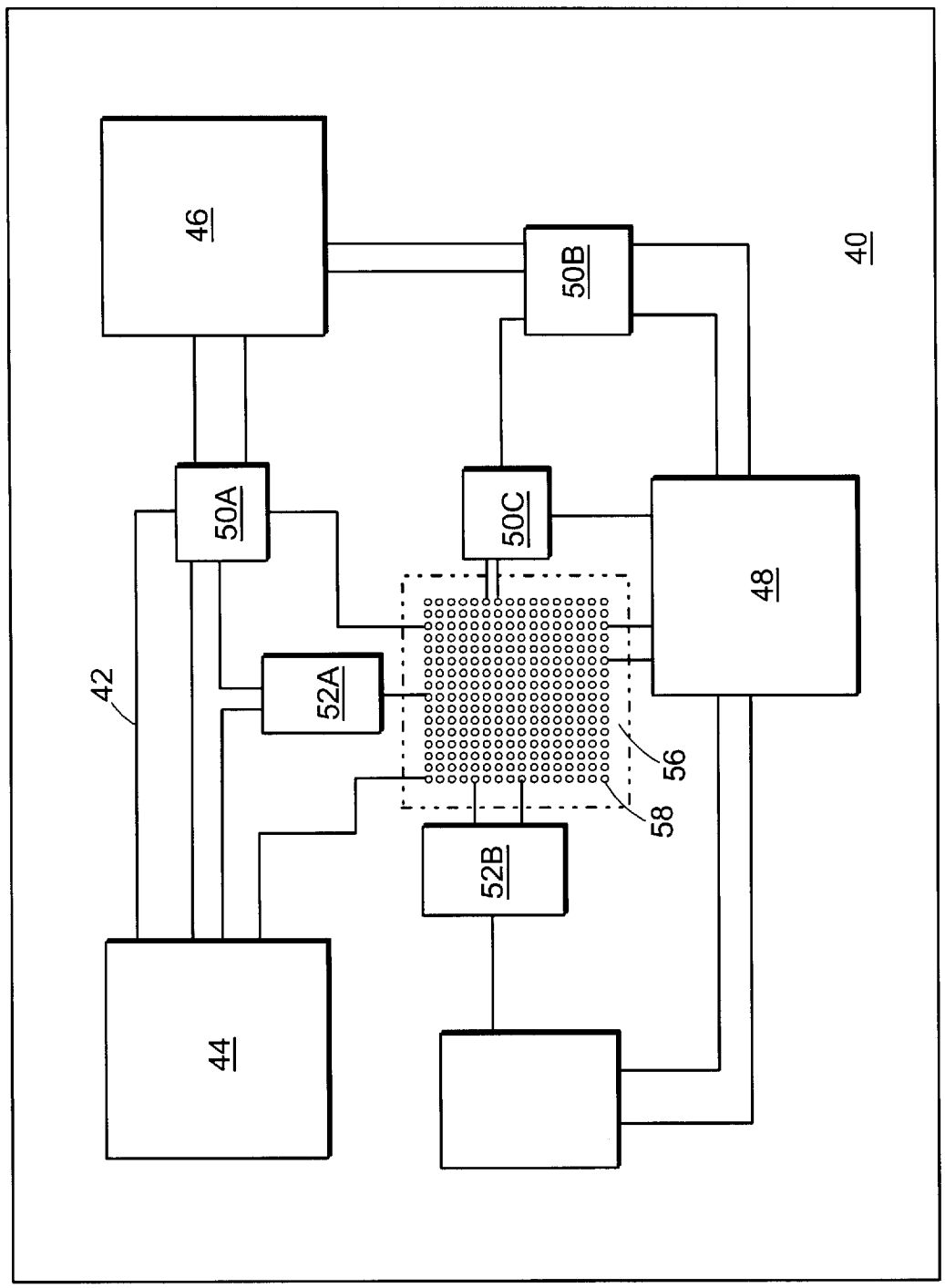
FIG. 3 is a top view of a printed circuit board (PCB) with a ball grid array (BGA) semiconductor device removed.

Referring to FIG. 3, an illustration of a printed circuit board 40 is shown. The printed circuit board has a plurality of conductive paths 42 which extend between devices. Boxes 44, 46 and 48 represent semiconductor devices. Squares 50A, B, C and Rectangles 52A and B represent other devices. A region 56 indicated by dash lines on the printed circuit board 40 receives a semiconductor device. The printed circuit board 40 has a plurality of contact pads 58 positioned to align with the ball grids of the semiconductor device.

Figure 4A:
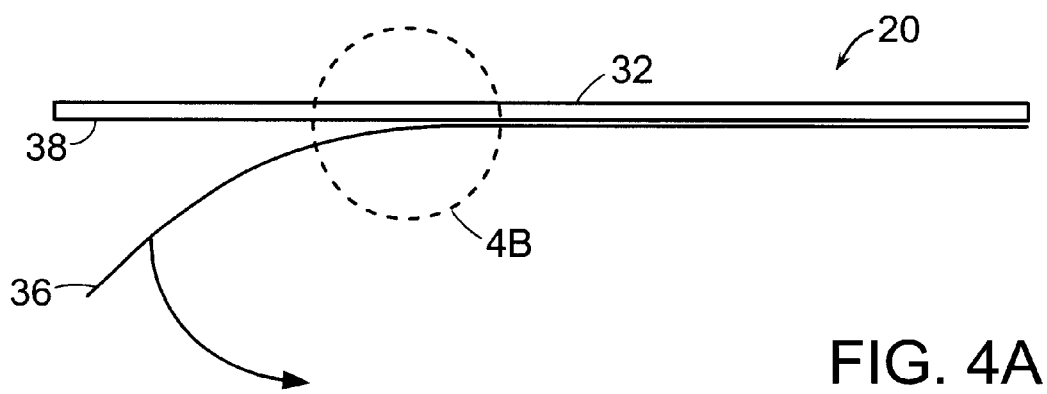
FIG. 4A is a side view of stencil with a disposable backing removed.
Figure 4B:
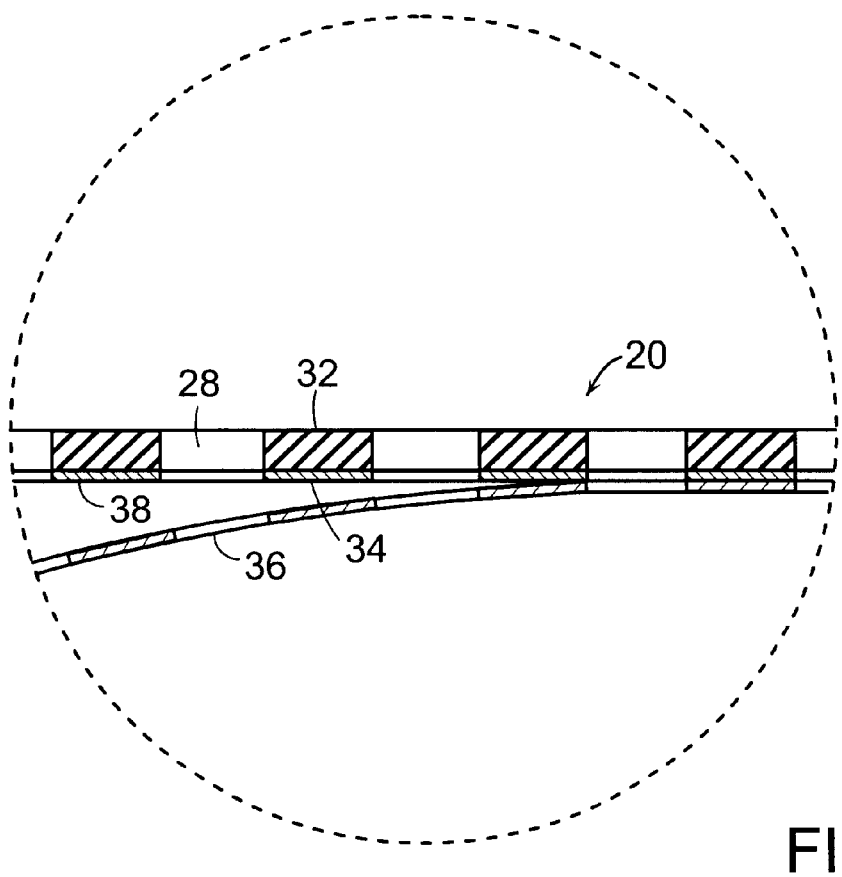
FIG. 4B is an enlarged sectional view of stencil along the area of FIG. 4A.

Referring to FIG. 4A, the disposable back 36 is peeled away from the stencil 20 to expose the adhesive 38 carried by the bottom surface 34 of the stencil. FIG. 4B shows apertures 28 located in the central region 22, as best seen in FIG. 1, which extend from the top surface 32 through the bottom surface 34 and through the disposable backing 36.

Figure 5:
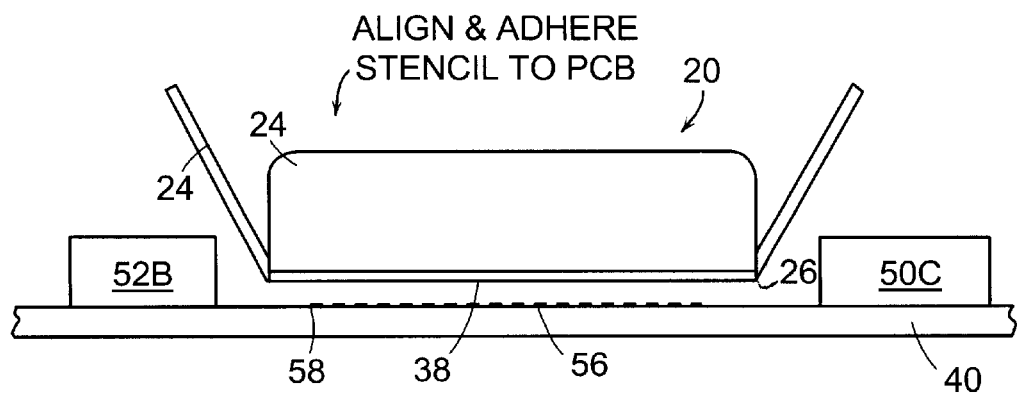
FIG. 5 is a side view of the stencil above the printed circuit board.

After the disposable backing 36 is removed from the stencil 20, the stencil 20 is aligned with the region 56 on the printed circuit board 40 which is to be reworked and receive the semiconductor device, as seen in FIG. 5. The apertures 28 such as seen in FIGS. 1 and 4B are aligned with the contact pads 58 on the printed circuit board. The stencil 20 is pressed onto the printed circuit board 40 such that the adhesive 38 on the bottom surface 34 maintains and creates a gasket around each of the apertures 28. The outer tabs 24 may be folded at the score lines 26, as seen in FIG. 1, to fit the stencil 20 within the region 56 and prevent interference by other components such as 50C and 52B on the printed circuit board 40.

Figure 6:
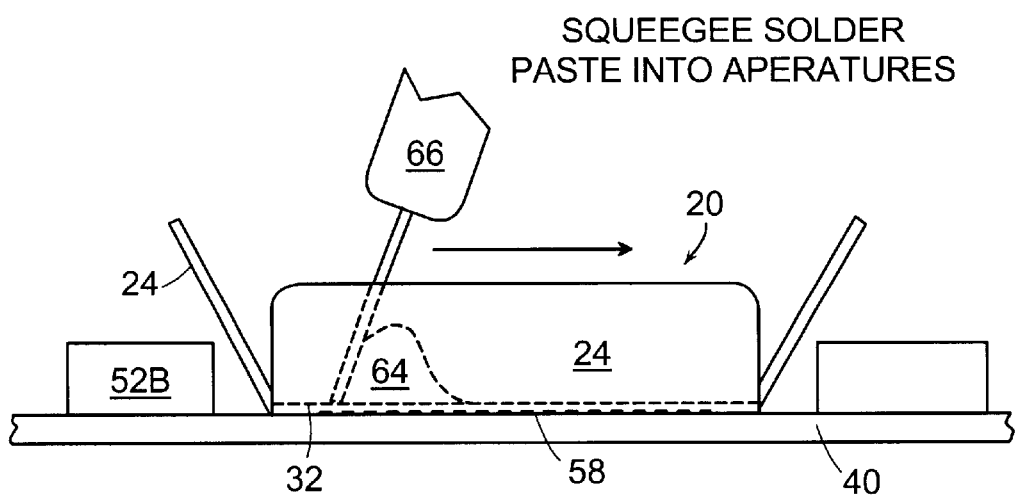
FIG. 6 is a side view of the stencil secured to the printed circuit board (PCB)
Figure 8:
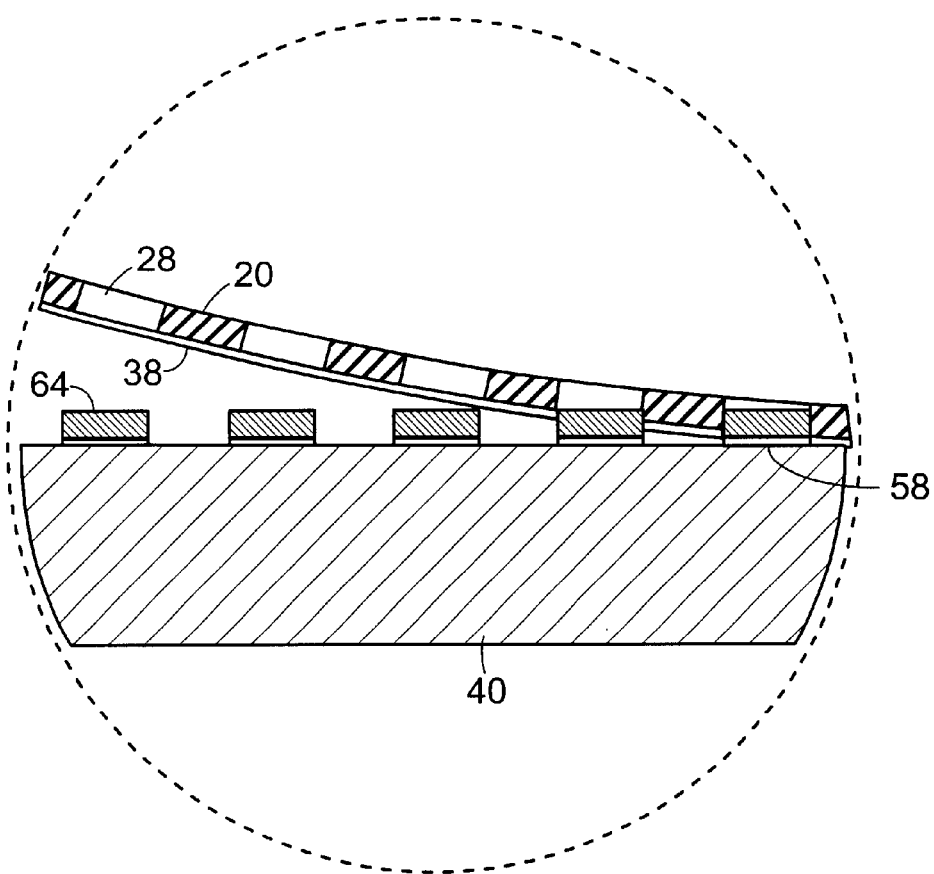
FIG. 8 is an enlarged sectional view of the stencil being removed from the printed circuit board.

Referring to FIG. 6, solder paste 64 is placed on the top surface 32 of the stencil apparatus 20 in the center region 22. A squeegee 66 is pulled across the top surface 32 of the stencil apparatus 20 to force solder paste 64 into the apertures 28. In contrast to previous embodiments, in that the adhesive retains the stencil 20 in tight engagement with the printed circuit board 40, the squeegee 66 may make numerous passes to ensure that all apertures 28, as best seen in FIG. 8, are properly filled. The outer tabs 24 which are folded upward in addition create a dam to prevent solder from passing over the edges of the stencil apparatus and then onto the printed circuit board.

Figure 7:
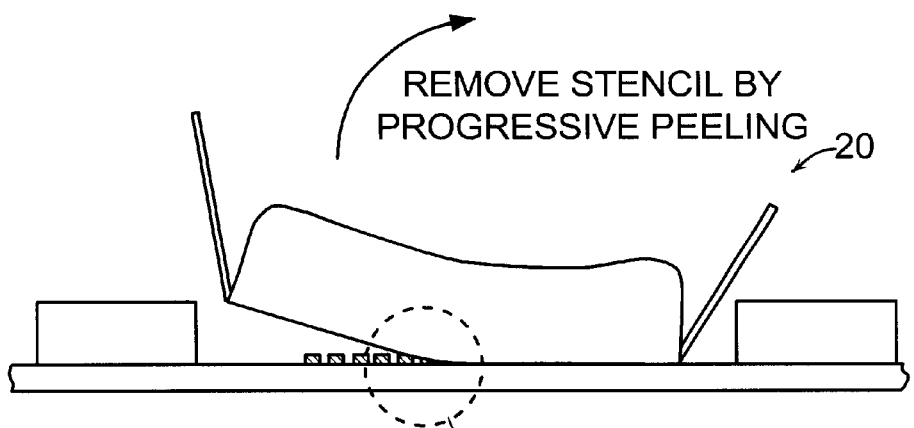
FIG. 7 is a side view with the stencil partially removed from the printed circuit board.

Referring to FIG. 7, one edge of the stencil is lifted to progressively peel the stencil apparatus 20 off of the printed circuit board 40. FIG. 8 shows an enlarged section of the stencil 20 being removed from the printed circuit board 40. The adhesive surface 38 which is located on the bottom surface 34 of the stencil apparatus is lifted with the stencil leaving no adhesive residue on the printed circuit board. The solder paste 64 which had completely filled the apertures 28 is deposited and aligned with the contact pads 58 on the printed circuit board 40.

While in a preferred embodiment, the adhesive 38 covers the bottom surface 34 of the stencil, it is recognized that the adhesive 38 may cover only the central region 22. Upon removal of stencil 20, the stencil 20 can be disposed. A new stencil 20 is used for the next rework job.

Figure 9:
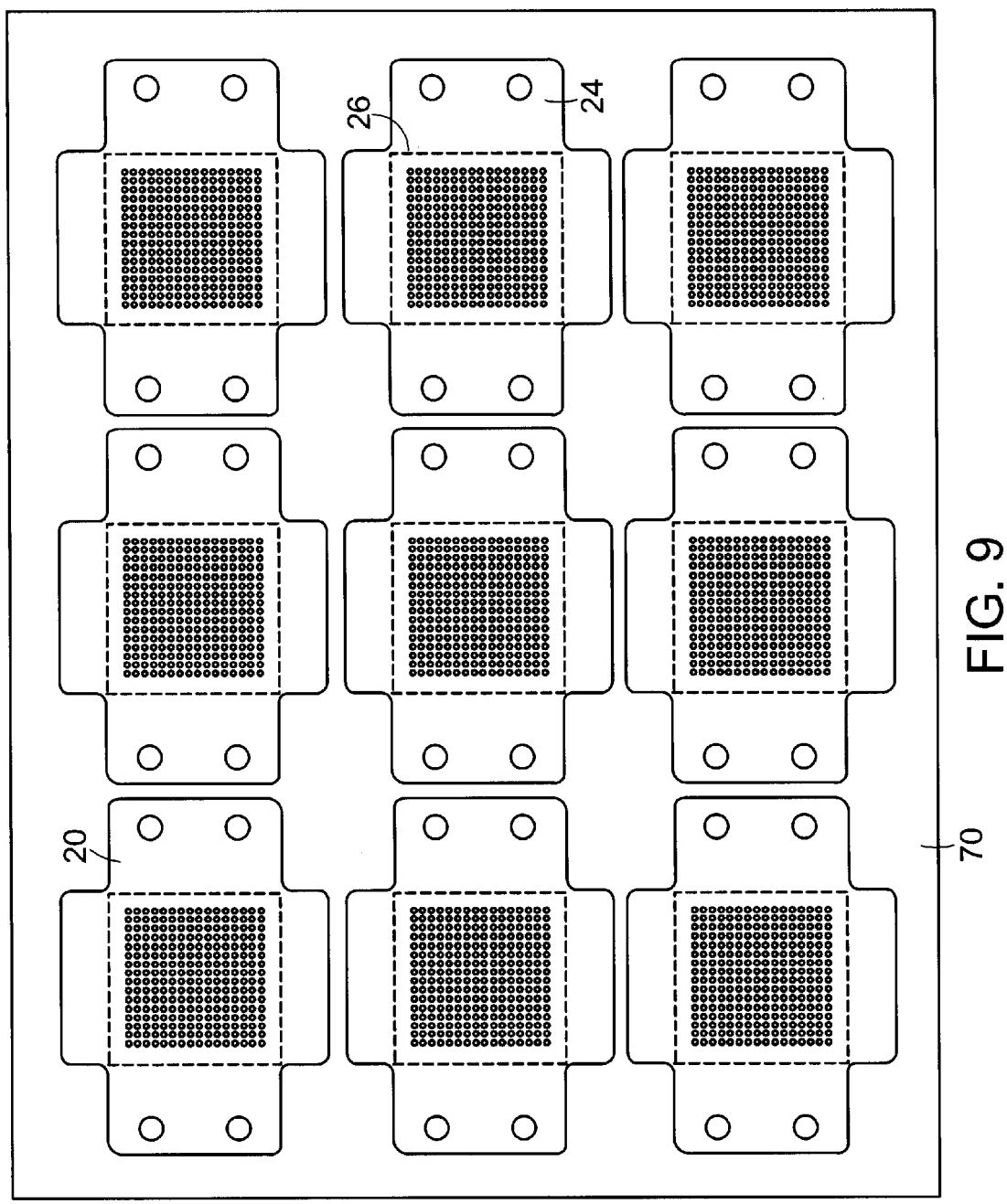
FIG. 9 is a top view of a sheet of stencils.

FIG. 9 illustrates a plurality of stencils 20 on a sheet 70. The stencils 20 are "kiss-cut" similar to a sheet of address labels and secured all to a single disposable backing. Each stencil 20 is removed as required with the disposable back remaining as part of the sheet.

Figure 10A:
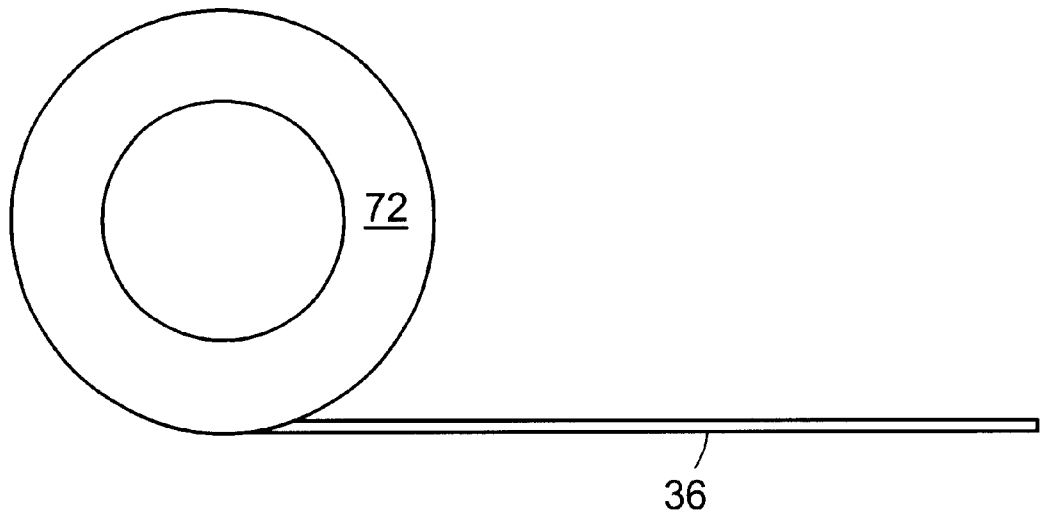
FIG. 10A is a top view of a roll of stencils.
Figure 10B:
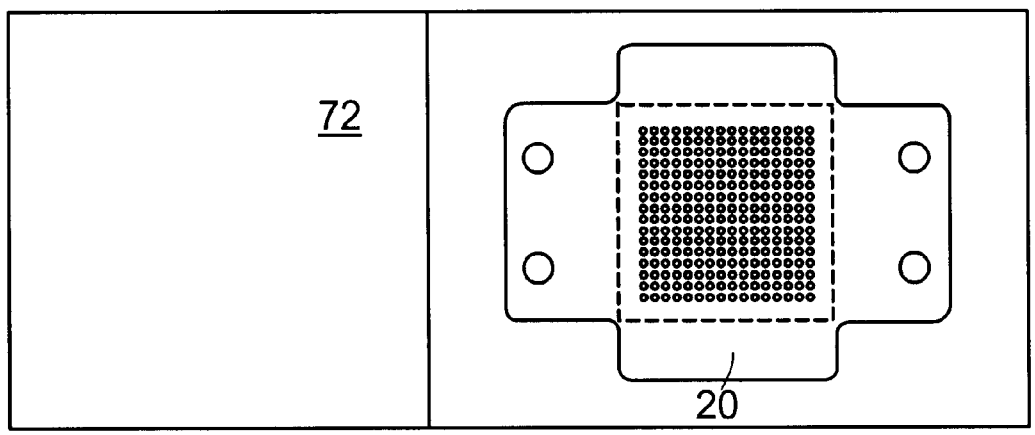
FIG. 10B is a side view of the roll of stencils.

FIGS. 10A and 10B show similar stencils in a roll form wherein the stencils are found singular in a series. Similar to the stencils 20 of FIG. 9, the stencils 20 are removed from the disposable back 36 as used. It is contemplated that the disposable back 36 will be torn away as necessary.

Figure 11:
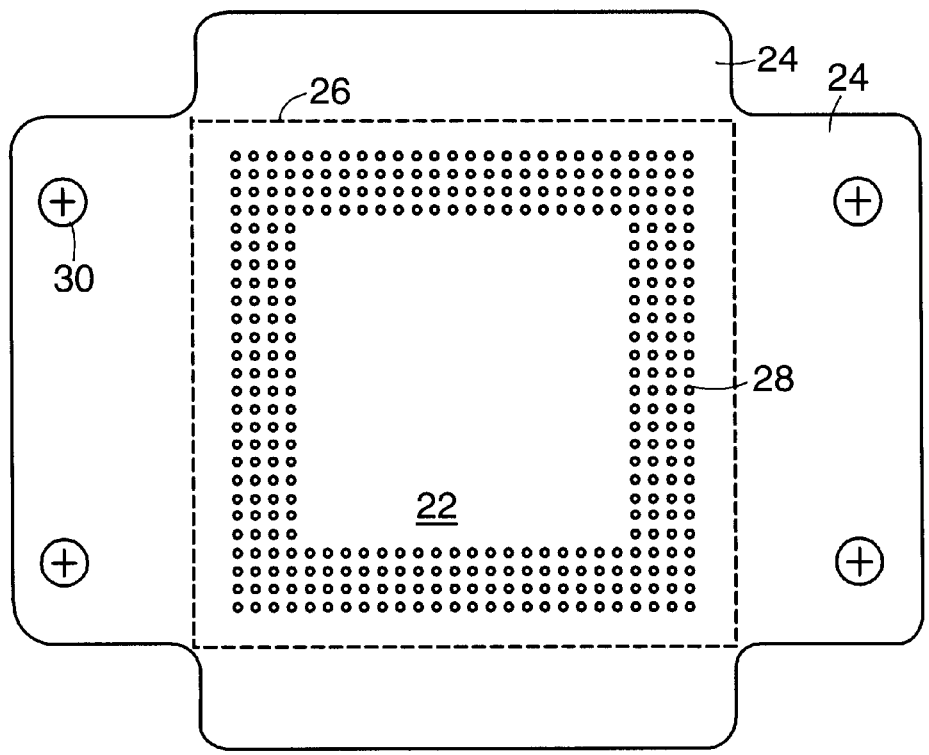
FIG. 11 is a top view of an alternative embodiment of a stencil.

FIG. 11 shows an alternative embodiment of the stencils. In this embodiment, the apertures 28 are located along the outer periphery of the central region 22 of the stencil 20. The center portion of the central region 22 does not have any apertures 28 in this embodiment. This type of stencil is used in conjunction with a periphery style ball grid array (BGA) semiconductor device that does not have ball grids in the center portion. The stencil 20 in addition has score lines 26 and a plurality of tooling holes 30.

This arrangement of apertures is in contrast to the full array shown in FIGS. 1, 9, and 10B. The pattern of apertures is dependent on the semiconductor package and the contact pad. It is recognized that numerous patterns are available.

In a preferred embodiment as an example, the central region 22 is approximately 37.5×37.5 mm (1.478 by 1.478 inches). The apertures 28 are 0.66 mm (0.026 inches) in diameter, with the spacing between the apertures 28 being 1.27 mm (0.050 inches).

Figure 12:
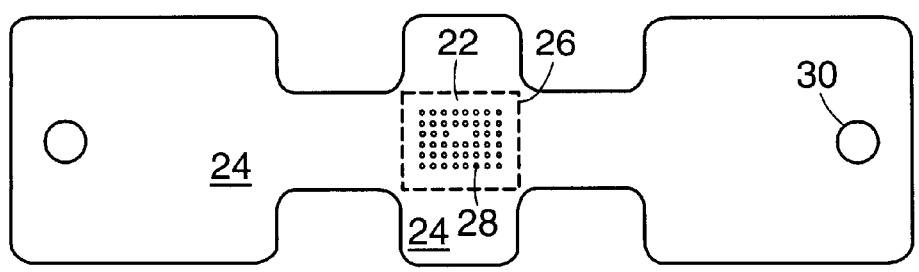
FIG. 12 is a top view of another embodiment of a stencil.

An alternative embodiment of the stencil is shown in FIG. 12. In this embodiment, the outer tabs extend in two general directions in two generally different lengths. The longer tabs are used to hold and position the stencil due to its otherwise small size.

In a preferred embodiment, the central region is approximately 8.13 mm (0.32 inches) by 7.11 mm (0.280 inches). The apertures 28 are 0.40 mm (0.016 inches) in diameter, with the spacing between the apertures 28 being 0.75 mm (0.0295 inches). The total length is 63.50 mm (2.50 inches) with the shorter outer tabs serving as solder dams and having a depth of 5.08 mm (0.20 inches). It is noted that in the embodiment shown, two apertures 28 in the array are missing, to reflect the pattern of the contact pads 58 on a PCB. As indicated above, the apertures 28 reflect the pattern of the contact pads and the patterns can vary. The apertures shown are just a few examples of some of the standard patterns.

In a preferred embodiment, the stencil 20 is made of an opaque polyester having a thickness of 0.075 mm (0.003 inches). A static dissipative coating is found on the top surface 32 for dissipation of potential static charges held by the stencil material. The bottom surface 34 receives the pressure sensitive adhesive. In a preferred embodiment, the adhesive is low tack, removable, acrylic adhesive and applied with a thickness of approximately 0.025 mm (0.001 inches). The disposable back 36 is formed from a coated paper or polymer film In another preferred embodiment, the stencil is made of a transparent polymer film to ease alignment. In another embodiment, the material is a laminated or coated paper.

The tooling holes 30 can be used in conjunction with an alignment fixture having pins for repeatably placing a stencil in the same location on similar PCBs when multiple PCBs are having the same device repaired.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method of applying a solder paste to a single component site on a circuit board comprising the steps of:
   providing a flexible polymer stencil having a plurality of apertures;
   folding the flexible stencil along preformed score lines to form flexible tabs for retaining solder paste on the stencil;
   aligning the stencil with a specific position on the circuit board such that the apertures align with contact points on the circuit board;
   securing the stencil to the circuit board by pressing an adhesive surface of the stencil against the circuit board;
   placing the solder paste on the stencil;
   pushing the solder paste into the apertures and onto the circuit board;
   removing the stencil by peeling the stencil from the circuit board.

2. The method of applying solder paste of claim 1 further comprising the step of disposing of the stencil.

3. The method of applying solder paste of claim 1 further comprising the step of removing a backing protecting the adhesive surface prior to aligning the stencil with the circuit board.

4. A stencil for application of solder paste to a circuit board comprising:
   a flexible polymer membrane having a top surface and a bottom surface, a plurality of specifically sized and spaced apertures extending from the top surface to the bottom surface and a plurality of score lines demarking a plurality of tabs from a central region wherein the flexible membrane is folded along the score lines to form flexible side tabs; and a removable adhesive carried by the bottom surface of the membrane adapted to secure to the circuit board for securing the membrane.

5. The stencil of claim 4 wherein the flexible membrane has a thickness of less than 0.153 millimeters.

6. The stencil of claim 4 wherein the polymer membrane is transparent.

7. The stencil of claim 4 wherein the polymer membrane is a polyester.

8. The stencil of claim 4 further comprising an anti-static coating on the top surface.

9. The stencil of claim 4 further comprising a disposable backing for covering the removable adhesive carried by the membrane.

10. The stencil of claim 4 wherein the apertures are positioned in a specific region of the flexible membrane.

11. The stencil of claim 10 wherein the removable adhesive is carried by the bottom surface of the flexible membrane in the specific region.

12. The stencil of claim 10 wherein the removable adhesive is carried by the entire bottom surface of the flexible membrane.

13. The stencil of claim 10 wherein the removable adhesive is carried by the bottom surface of the flexible membrane in a portion of the specific region.

14. A stencil for application of solder paste to a circuit board comprising:

a flexible laminated paper having a top surface and a bottom surface a plurality of specifically sized and spaced apertures extending from the top surface to the bottom surface and a plurality of score lines demarking a plurality of tabs from a central region wherein the flexible membrane is folded along the score lines to form flexible side tabs; and a removable adhesive carried by the bottom surface of the paper adapted to secure to the circuit board for securing the paper.

15. A stencil for application of solder paste to a circuit board comprising:

a flexible polycoated paper having a top surface and a bottom surface a plurality of specifically sized and spaced apertures extending from the top surface to the bottom surface, and a plurality of score lines demarking a plurality of tabs from a central region wherein the flexible membrane is folded along the score lines to form flexible side tabs; and a removable adhesive carried by the bottom surface of the paper adapted to secure to the circuit board for securing the paper.

16. A method of reworking a single component of a populated circuit board comprising the steps of:

providing a flexible polymer stencil having a plurality of apertures;

folding the flexible polymer stencil along preformed score lines to form flexible tabs for retaining solder paste on the stencil and to tailor the stencil to fit within the size constraints of the circuit board;

aligning the stencil with the position on the circuit board such that the apertures align with contact points on the circuit board;

securing the stencil to the circuit board by pressing an adhesive surface of the stencil against the circuit board;

placing the solder paste on the stencil;

pushing the solder paste into the apertures and onto the circuit board; and removing the stencil by peeling the stencil from the circuit board.

17. The method of reworking a circuit board of claim 16 further comprising the step of disposing of the stencil.

18. The method of reworking a circuit board of claim 17 further comprising the step of removing a backing protecting the adhesive surface prior to aligning the stencil with the circuit board.

19. The method of reworking a circuit board of claim 16 further comprising the step of cutting the stencil to fit the location.

20. A stencil for application of solder paste to a single component site of a circuit board comprising:

a flexible polymer membrane having a top surface and a bottom surface and a plurality of specifically sized and spaced apertures on a central region extending from the top surface to the bottom surface;

a plurality of score lines on the flexible membrane demarking a plurality of tabs from the central region wherein the flexible membrane is folded along the score lines; and a removable adhesive carried by the bottom surface of the polymer membrane adapted to secure to the circuit board for securing the membrane.

21. The stencil of claim 20 wherein the removable adhesive is carried by the bottom surface of the flexible membrane in the central region.

* * * * *